United States Patent
Cai et al.

(10) Patent No.: US 9,263,583 B2
(45) Date of Patent: Feb. 16, 2016

(54) INTEGRATED FINFET-BJT REPLACEMENT METAL GATE

(71) Applicant: GLOBALFOUNDRIES INC., Grand Cayman (KY)

(72) Inventors: Jin Cai, Cortlandt Manor, NY (US); Effendi Leobandung, Stormville, NY (US); Tak H. Ning, Yorktown Heights, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/052,924

(22) Filed: Oct. 14, 2013

(65) Prior Publication Data

US 2015/0102348 A1  Apr. 16, 2015

(51) Int. Cl.
*H01L 29/78* (2006.01)
*H01L 29/73* (2006.01)
*H01L 21/8222* (2006.01)
*H01L 21/8248* (2006.01)

(52) U.S. Cl.
CPC .............. *H01L 29/785* (2013.01); *H01L 29/73* (2013.01); *H01L 21/8222* (2013.01); *H01L 21/8248* (2013.01)

(58) Field of Classification Search
CPC . H01L 29/73; H01L 29/785; H01L 29/66545; H01L 21/8222; H01L 21/8228; H01L 21/8248; H01L 21/823842; H01L 27/0623
See application file for complete search history.

(56) References Cited

U.S. PATENT DOCUMENTS

| 7,271,083 | B2 * | 9/2007 | Tu et al. .......................... 438/597 |
| 7,834,403 | B2 | 11/2010 | Kakoschke et al. |
| 7,939,416 | B2 | 5/2011 | Nuttinck et al. |
| 8,183,120 | B2 | 5/2012 | Kakoschke et al. |
| 8,278,173 | B2 * | 10/2012 | Lim et al. ....................... 438/275 |
| 2009/0045467 | A1 | 2/2009 | Kakoschke et al. |
| 2009/0309167 | A1 | 12/2009 | Russ et al. |
| 2011/0156154 | A1 * | 6/2011 | Hoentschel et al. .......... 257/369 |
| 2012/0049282 | A1 | 3/2012 | Chen et al. |
| 2013/0126979 | A1 * | 5/2013 | Chern et al. ................... 257/379 |
| 2013/0249010 | A1 * | 9/2013 | Ng et al. ........................ 257/369 |
| 2014/0183652 | A1 * | 7/2014 | Chern et al. ................... 257/369 |

* cited by examiner

*Primary Examiner* — Michael Lebentritt
*Assistant Examiner* — Jordan Klein
(74) *Attorney, Agent, or Firm* — Scully, Scott, Murphy & Presser P.C.

(57) ABSTRACT

A method of forming a semiconductor structure that includes forming a first recess and a second recess between a first pair of sidewall spacers and a second pair of sidewall spacers respectively, the first and second pair of sidewall spacers surrounding a fin on top of a buried dielectric layer, the fin is formed from a top most semiconductor layer of a semiconductor-on-insulator substrate. A high-k dielectric layer is deposited within the first and second recesses and a dummy titanium nitride layer is deposited on the high-k dielectric layer. The high-k dielectric layer and the dummy titanium nitride layer are removed from the second recess and a silicon cap layer is deposited within the first and second recesses. Next, dopants are implanted into the silicon cap layer in the second recess without implanting dopants into the silicon cap layer in the first recess to form a BJT device.

14 Claims, 13 Drawing Sheets

INTEGRATED FINFET-BJT REPLACEMENT METAL GATE

BACKGROUND

The present invention generally relates to semiconductor devices, and more particularly, to replacement metal gate (RMG) in bipolar complementary metal-oxide-semiconductor (BiCMOS) devices.

As integrated circuits continue to scale downward in size, fin field effect transistors (FinFETs) or tri-gate structures are becoming more widely used, primarily because FinFETs offer better performance than planar FETs at the same power budget. FinFETs are three dimensional (3-D), fully depleted metal-oxide semiconductor field effect transistor (MOSFET) devices representing an important part of advanced complementary metal-oxide semiconductor (CMOS) fabrication technology to create ever decreasing microelectronic devices.

FinFETs have a fin structure formed from the semiconductor substrate material extending between the device source and drain enfolding a channel region forming the bulk of the semiconductor device. The gate structure is located over the fins covering the channel region. Such architecture allows for a more precise control of the conducting channel by the gate, significantly reducing the amount of current leakage when the device is in off state.

CMOS devices, including FinFETs, may be combined with bipolar junction transistor (BJT) devices in bipolar complementary metal-oxide-semiconductor (BiCMOS) integrated circuits, which take advantage of the positive characteristics of both transistor types in the construction of the integrated circuit.

Bipolar junction transistor (BJT) technology may be typically found in demanding types of integrated circuits, especially integrated circuits for high-frequency applications. One high-frequency application for BJTs is in radiofrequency integrated circuits (RFICs), which are used in wireless communications systems, power amplifiers in cellular telephones, and other types of high speed integrated circuits. Conventional BJTs are three-terminal electronic devices that include three semiconductor regions, namely an emitter, a base, and a collector. Generally, a BJT includes a pair of p-n junctions, namely a collector-base junction and an emitter-base junction. A voltage applied across the emitter-base junction of a BJT controls the movement of charge carriers that produce charge flow between the collector and emitter regions of the BJT.

An NPN bipolar junction transistor includes two regions of N-type semiconductor material constituting the emitter-collector region, and a region of P-type semiconductor material located between the two regions of N-type semiconductor material constituting the base region of a NPN BJT device. A PNP bipolar junction transistor has two regions of P-type semiconductor material constituting the emitter-collector region, and a region of N-type semiconductor material located between the two regions of P-type semiconductor material constituting the base region of a PNP BJT device.

Scaling down of FETs dimensions requires a high-k metal gate to reduce gate leakage and improve device performance. A polycrystalline silicon material, commonly referred as polysilicon or poly, is normally used in the gate manufacturing process. Polysilicon exhibits high thermal resistivity, which makes a polysilicon gate resistant to high temperature processes such as high temperature annealing. The replacement of a polysilicon gate with a metal gate electrode is frequently used in advanced FinFET CMOS technology to address problems related to high temperature processing on metal materials. This process is known as replacement metal gate (RMG) or gate last process. A RMG process includes the formation of a dummy polysilicon gate structure, commonly referred to as a dummy poly gate or simply a dummy gate, enfolding the device fins. The device manufacturing may continue until deposition of an interlayer dielectric (ILD) layer. After the ILD layer deposition, the dummy gate may be removed and replaced with a high-k metal gate.

SUMMARY

Improved RMG processes integrating BiCMOS transistor technology may facilitate advancing the capabilities of current high-k device technology.

According to one embodiment of the present disclosure, a method of forming a semiconductor structure includes: forming a first recess and a second recess between a first pair of sidewall spacers and a second pair of sidewall spacers respectively, the first pair of sidewall spacers and the second pair of sidewall spacers surrounding a fin on top of a buried dielectric layer, the fin is formed from a top most semiconductor layer of a semiconductor-on-insulator substrate, and it extends outwardly from a gate structure formed over the buried dielectric layer. Next a high-k dielectric layer is deposited within the first recess and within the second recess, a dummy titanium nitride layer is deposited on the high-k dielectric layer, then the high-k dielectric layer and the dummy titanium nitride layer are removed from the second recess without removing them from the first recess. A silicon cap layer is deposited to fill the first recess and the second recess, the silicon cap layer is formed above the high-k dielectric layer and dummy titanium nitride layer in the first recess. Subsequently, dopants are implanted into the silicon cap layer in the second recess without implanting dopants into the silicon cap layer in the first recess to form a BJT device.

According to another embodiment of the present disclosure, a method of forming a semiconductor structure includes: forming a first dummy gate above a first fin formed from a SOI layer of a semiconductor substrate, the first dummy gate being located between first sidewall spacers with a portion of the first fin not covered by the first dummy gate defining a first source-drain region, forming a second dummy gate above a second fin formed from the SOI layer of the semiconductor substrate, the second dummy gate being located between second sidewall spacers with a portion of the second fin not covered by the second dummy gate defining a second source-drain region, removing the first dummy gate and the second dummy gate to create a first recess and a second recess between the first sidewall spacers and the second sidewall spacers respectively. Next, a high-k dielectric layer is deposited within the first recess and within the second recess, and a dummy titanium nitride layer is deposited on the high-k dielectric layer. The high-k dielectric layer and the dummy titanium nitride layer are removed from the second recess without removing the high-k dielectric and dummy titanium nitride layers from the first recess. A silicon cap layer is deposited to fill the first recess and the second recess, the silicon cap layer being formed above the high-k dielectric layer and dummy titanium nitride layer in the first recess. Subsequently, dopants are implanted into the silicon cap layer in the second recess without implanting dopants into the silicon cap layer in the first recess to form a BJT device. The silicon cap layer in the first recess is now removed and a metal gate is formed on top of the high-k dielectric layer and dummy titanium nitride layer in the first recess.

According to another embodiment of the present disclosure, a semiconductor structure includes: a metal gate on a top surface of a buried oxide layer of a SOI substrate enfolding a first fin, a portion of the first fin not covered by the metal gate defining a source-drain region of a FinFET device, a base region enfolding a second fin, a portion of the second fin not covered by the base region defining an emitter-collector region of a BJT device, a cap layer located above the SOI substrate, an ILD layer located above the cap layer and between the FinFET and BJT devices and a plurality of contacts formed in the ILD layer.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Exemplary embodiments now will be described more fully herein with reference to the accompanying drawings, in which exemplary embodiments are shown. This invention may, however, be modified in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessary obscuring the presented embodiments.

One method of manufacturing a BiCMOS structure depicting a FinFET device and a BJT device formed in a shared semiconductor substrate is described in detail below by referring to the accompanying drawings in FIGS. 1-13, in accordance with illustrative embodiments of the present disclosure. More specifically, the method may include integrating a FinFET CMOS replacement metal gate (RMG) process flow with formation of bipolar junction transistors (BJTs) on the same semiconductor substrate.

For illustration purposes only, without intent of limitation, in FIGS. 1-13 and in the discussion the FinFET and BJT devices are contiguously formed within a semiconductor substrate. However, it can be understood by a person skilled in the art that the FinFET and BJT devices can be formed in different areas of the semiconductor substrate without necessarily being adjacent to one another.

Figure 1:
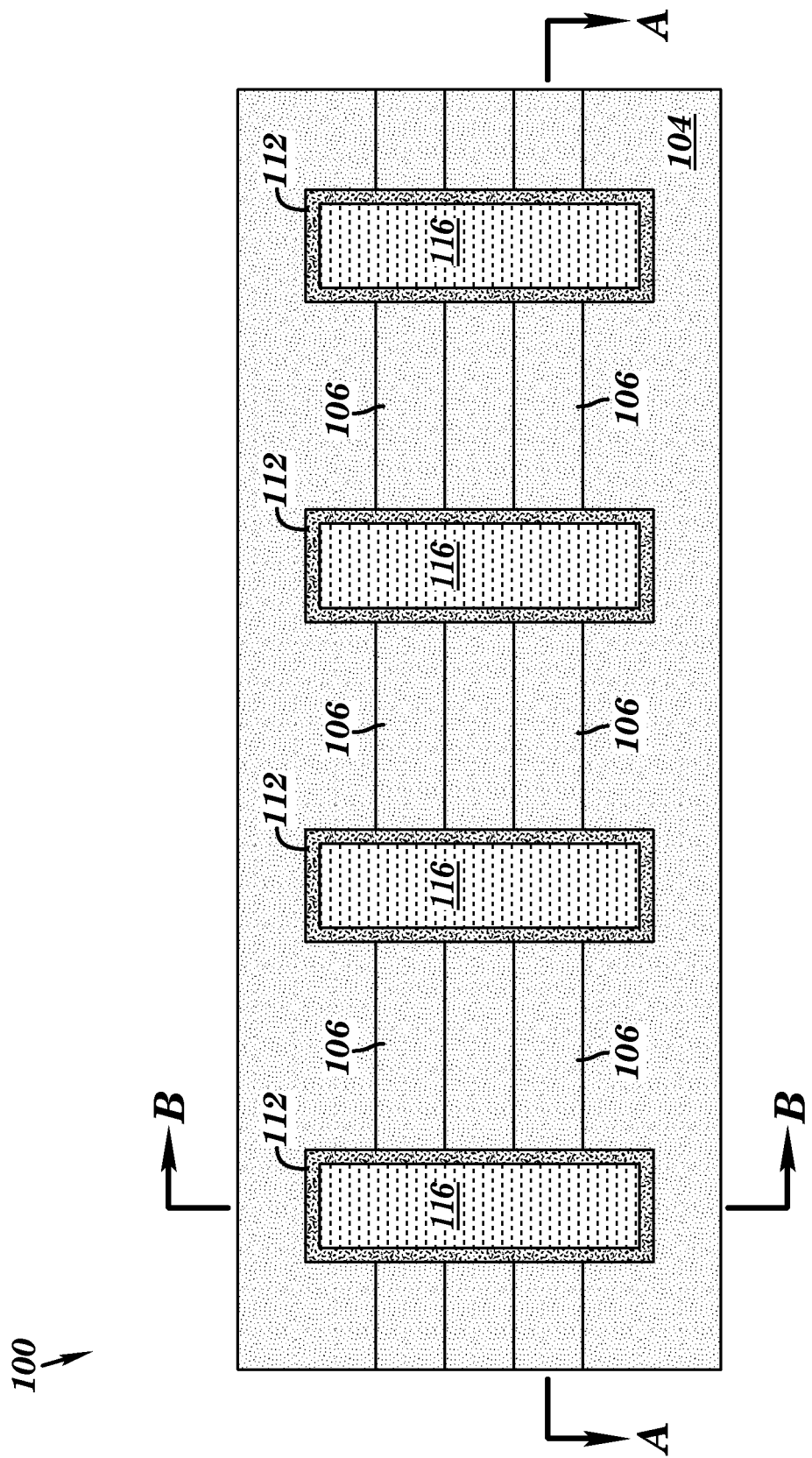
FIG. 1 is a top view of a semiconductor structure depicting an intermediate step during a replacement metal gate process, according to an embodiment of the present disclosure.

Referring to FIG. 1, a top view of a semiconductor structure 100 is shown at an intermediate step during a replacement metal gate (RMG) process flow. At this step of the RMG process, the semiconductor structure 100 may be generally complete with a gate structure 116 including a dummy gate. The gate structure 116 (hereafter "dummy gate") can be formed over a portion of a fin 106. The fin 106 may be etched from an SOI substrate 105 (shown in FIG. 2) using typical photolithography techniques such as for example: sidewall image transfer (SIT). The fin 106 may be primarily formed from an SOI layer (not shown) of the SOI substrate 105 (shown in FIG. 2). Typically, the SOI layer may be entirely consumed during the process of forming the fin 106. In one embodiment, the fin 106 may include a height of about 4 nm to about 40 nm, and a width of about 2 nm to about 20 nm.

It should be noted that while this description refers to some components of the semiconductor structure 100 in the singular tense, more than one component may be depicted throughout the figures and like components are labeled with like numerals.

Figure 2:
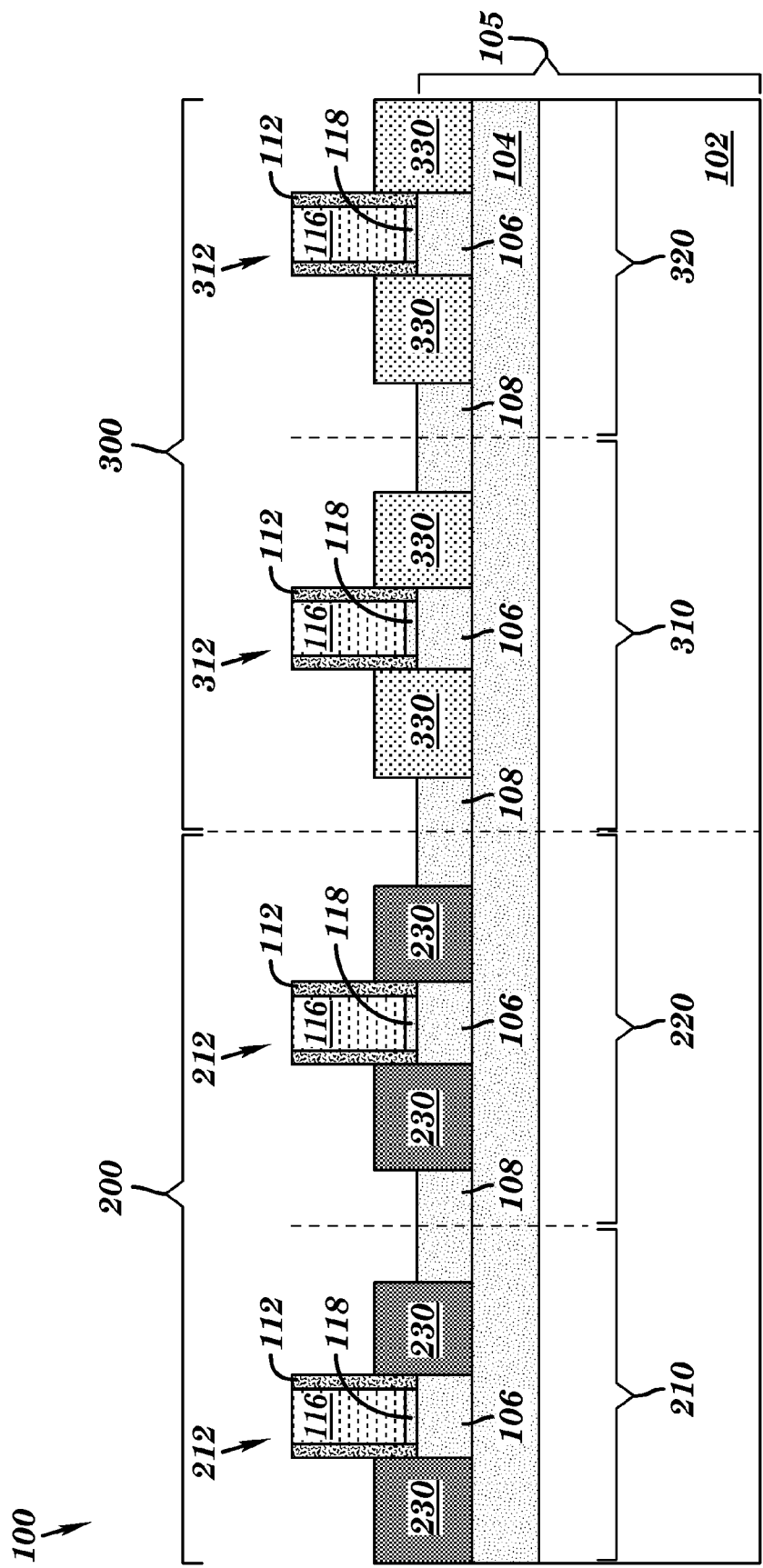
FIG. 2 is a cross-sectional view of FIG. 1 taken along section line A-A, according to an embodiment of the present disclosure.

Referring now to FIG. 2, a cross-sectional view of FIG. 1 taken along section line A-A is shown. In this embodiment, the SOI substrate 105 may include a base substrate 102, a buried dielectric layer 104 (e.g., buried oxide) formed on top of the base substrate 102, and a SOI layer 106 formed on top of the buried dielectric layer 104. The buried dielectric layer 104 isolates the SOI layer 106 from the base substrate 102. The base substrate 102 may be made from any of several known semiconductor materials such as, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the base substrate 102 may be about, but is not limited to, several hundred microns thick. For example, the base substrate 102 may include a thickness ranging from 0.5 mm to about 1.5 mm.

The buried dielectric layer 104 may be formed from any of several known dielectric materials. Non-limiting examples include, for example, oxides, nitrides and oxynitrides of silicon. Oxides, nitrides and oxynitrides of other elements are also envisioned. In addition, the buried dielectric layer 104 may include crystalline or non-crystalline dielectric material. Moreover, the buried dielectric layer 104 may be formed using any of several known methods. Non-limiting examples include ion implantation methods, thermal or plasma oxidation or nitridation methods, chemical vapor deposition methods and physical vapor deposition methods. Alternatively, the buried dielectric layer 104 may include a thickness ranging from about 10 nm to about 500 nm. In one embodiment, the buried dielectric layer 104 may be about 150 nm thick.

The SOI layer (not shown) may include any of the several semiconductor materials included in the base substrate 102. In general, the base substrate 102 and the SOI layer may include either identical or different semiconductor materials with respect to chemical composition, dopant concentration and crystallographic orientation. The SOI layer may include a thickness ranging from about 5 nm to about 100 nm that may be entirely consumed during patterning of fin 106. Methods for forming the SOI layer are well known in the art. Non-limiting examples include SIMOX (Separation by Implantation of Oxygen), wafer bonding, and ELTRAN® (Epitaxial Layer TRANsfer).

With continued reference to FIG. 2, the semiconductor structure 100 may further include an N-type region 200 and a P-type region 300. The N-type region 200 may include an N-channel metal-oxide semiconductor (NMOS) sub-region 210 and an NPN BJT sub-region 220. The NMOS sub-region 210 may include an NMOS device 212. At this point of the manufacturing process, the NPN BJT sub-region 220 may also include an NMOS device 212 that will be converted in subsequent steps (described below) to an NPN BJT device.

Similarly, the P-type region 300 may include a P-channel metal-oxide semiconductor (PMOS) sub-region 310 and a PNP BJT sub-region 320. The PMOS sub-region 310 may include a PMOS device 312. At this point of the manufacturing process, the PNP BJT sub-region 320 may also include a PMOS device 312 that will be converted in subsequent steps (described below) to a PNP BJT device.

The process of forming NMOS and PMOS devices is very well known in the art and generally may include forming a gate structure within an N-doped or P-doped semiconductor substrate over a portion of a fin covering a channel region, where the uncovered portion of the fin defines a source-drain region. It is understood that commonly NMOS and PMOS devices may be formed simultaneously within the same semiconductor substrate, and that both NMOS and PMOS devices may be used together in an integrated circuit. Typically, NMOS and PMOS devices may be separated from one another both physically and electrically by an isolation region 108. In FinFET process flow, the isolation region 108 may be filled with any suitable dielectric material.

With continued reference to FIG. 2, the NMOS devices 212 and PMOS devices 312 may have a dummy gate dielectric 118 which may be formed over the fin 106 by any deposition method known in the art, for example, by chemical vapor deposition (CVD), plasma-enhanced chemical vapor deposition (PECVD), high-density CVD (HDCVD), physical vapor deposition (PVD), plating, sputtering, evaporation, and chemical solution deposition of a dielectric material. Alternatively, the dummy gate dielectric 118 may be formed through oxidizing a top surface of the SOI substrate 105. In one embodiment, the dummy gate dielectric 118 may include a high-k dielectric material having a dielectric constant greater than, for example, 3.9, which is the dielectric constant of silicon oxide.

With continued reference to FIG. 2, the semiconductor structure 100 may further include a dummy gate 116. The dummy gate 116 may be formed using conventional techniques known in the art. For example, the dummy gate 116 may be formed by depositing a blanket layer of polysilicon.

The dummy gate 116 may include sidewall spacers 112. The sidewall spacers 112 may be formed by depositing or growing a conformal dielectric layer, followed by an anisotropic etch that removes the dielectric from the horizontal surfaces of the semiconductor structure 100, while leaving it on the sidewalls of the dummy gate 116. In a RMG process flow the sidewall spacers 112 may remain on the sidewalls of the dummy gate 116. In one embodiment, the sidewall spacers 112 may include any suitable dielectric material such as silicon nitride. In one embodiment, the sidewall spacers 112 may have a horizontal width, or thickness, ranging from about 3 nm to about 30 nm. The sidewall spacers 112 may include a single layer of dielectric material; however, multiple layers of dielectric material may also be embodied. The sidewall spacers 112 may be positioned along the sidewalls of the dummy gate 116 surrounding the fin 106 on top of the buried dielectric layer 104. The sidewall spacers 112 may separate a subsequently formed metal gate from a source-drain region.

Figure 3:
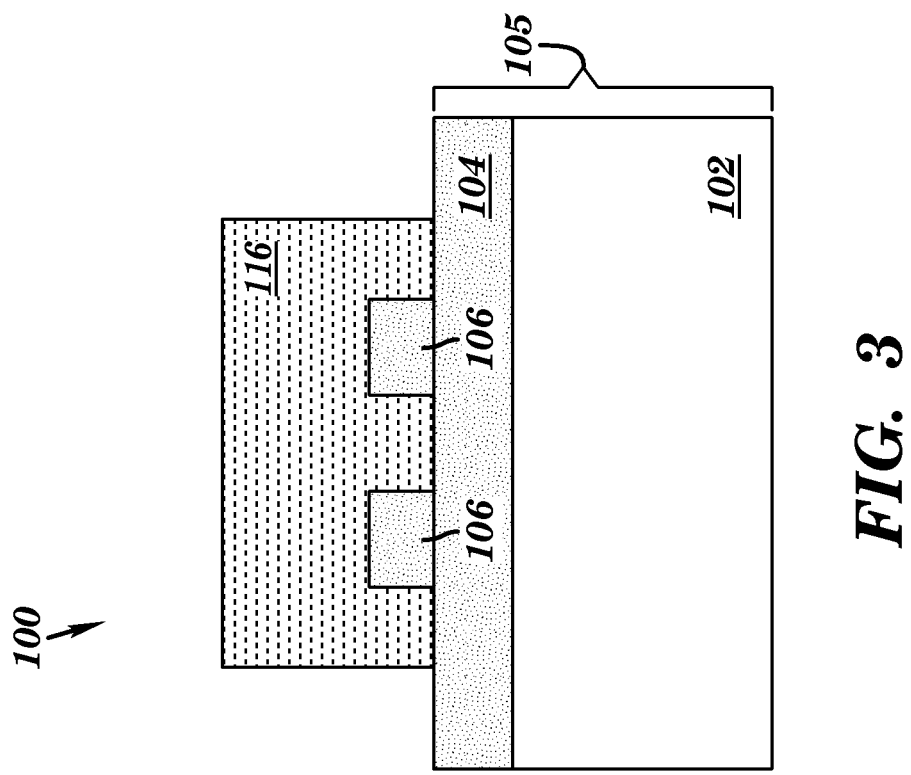
FIG. 3 is a cross-sectional view of FIG. 1 taken along section line B-B, according to an embodiment of the present disclosure.

Referring now to FIG. 3, a cross-sectional view of FIG. 1 taken along section line B-B is shown. It should be noted that in this view of the semiconductor structure 100, only the base substrate 102, the BOX layer 104, the sidewall spacers 112 and the fin 106 are illustrated.

Figure 4:
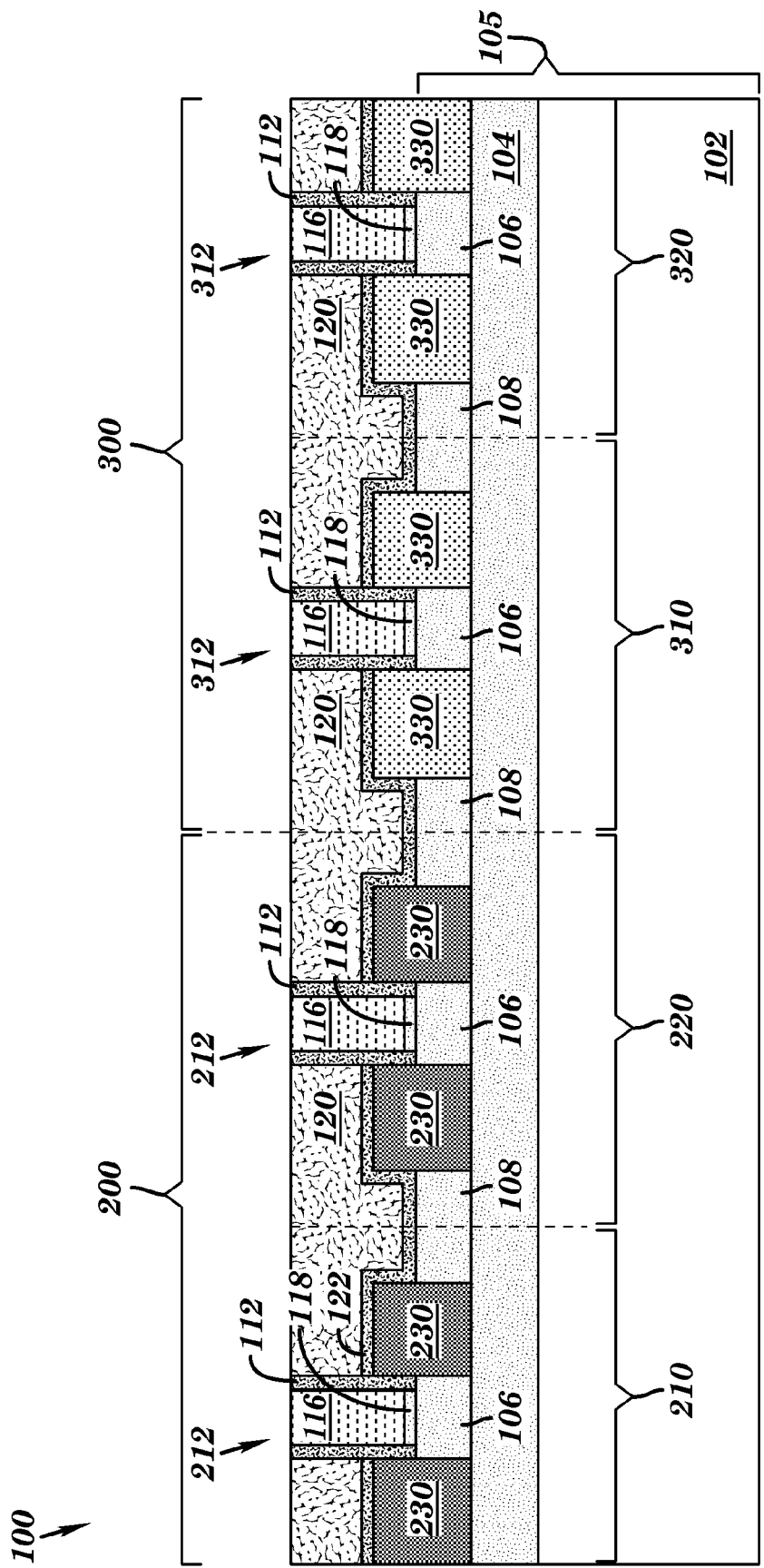
FIG. 4 is a cross-sectional view of FIG. 1 taken along section line A-A depicting the formation of a cap layer and an interlayer dielectric (ILD) layer, according to an embodiment of the present disclosure.

Referring now to FIG. 4, a cap layer 122 and an interlayer dielectric (ILD) layer 120 have been formed. The ILD layer 120 may be formed above the cap layer 122 according to an embodiment of the present disclosure.

The cap layer 122 may be deposited by means of any suitable deposition method and may have a thickness ranging from about 5 nm to about 30 nm and ranges there between. The cap layer 122 may include an insulator of silicon nitride, silicon carbide or the like which may function as both a barrier, particularly when a low-k material that may be subject to diffusion of moisture is used as the ILD layer, and an etch stop.

The ILD layer 120 may be deposited above the cap layer 120 by any deposition method known in the art. The ILD layer 120 may have a thickness ranging from about 30 nm to about 100 nm and ranges there between. The ILD layer 120 may include: silicon oxide, silicon nitride, silicon oxynitride, carbon-doped silicon oxide or any other suitable dielectric material that may fill the gaps between dummy gates 116 and other existing devices within the semiconductor substrate 110.

Figure 5:
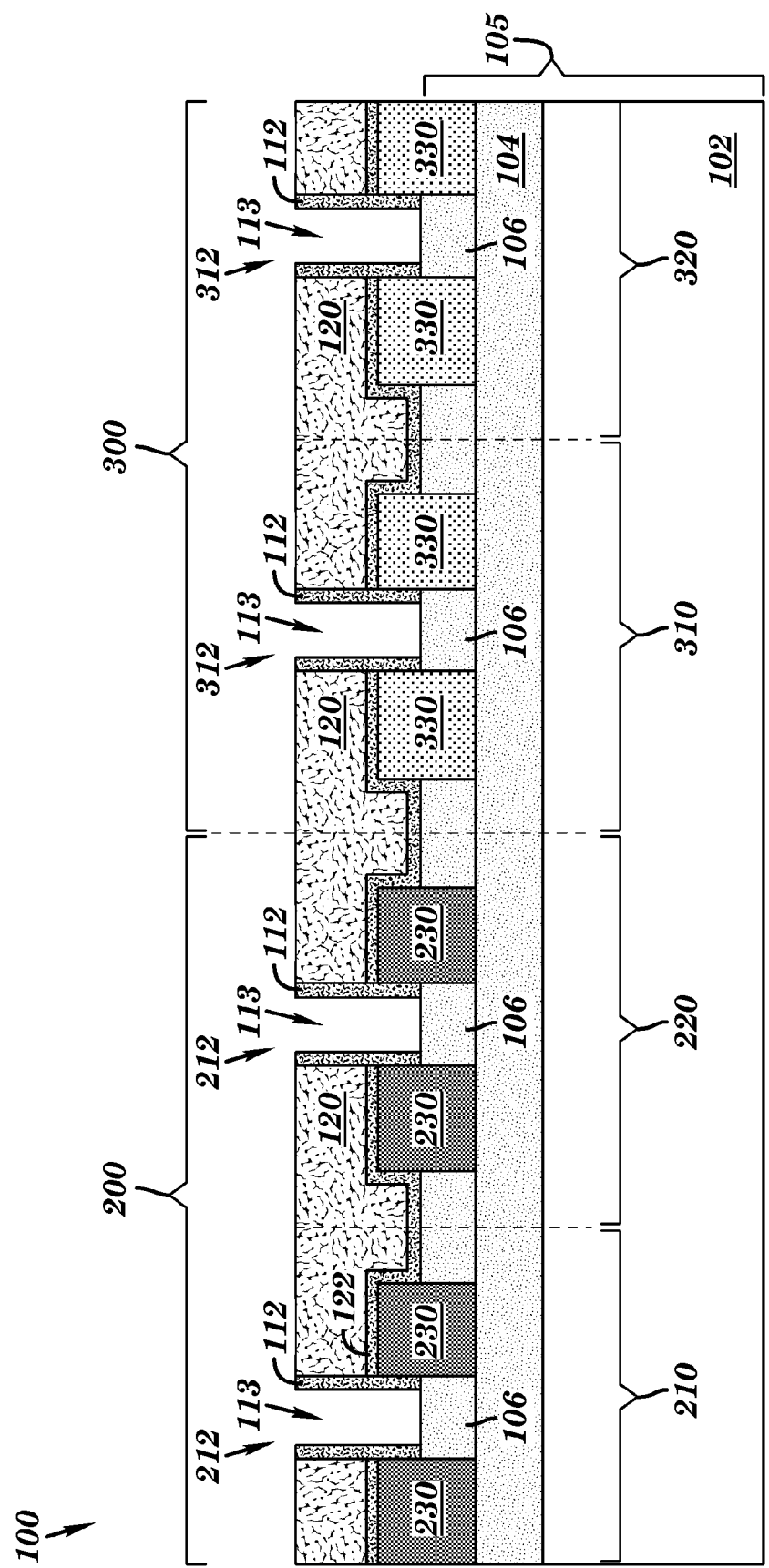
FIG. 5 is a cross-sectional view of FIG. 1 taken along section line A-A depicting the removal of dummy gates from the CMOS devices in the semiconductor substrate, according to an embodiment of the present disclosure.

Referring now to FIG. 5, the dummy gate 116 and the dummy gate dielectric 118 shown in FIG. 4 may be removed from the NMOS FinFET devices 212 in the N-type region 200 and from the PMOS FinFET devices 312 in the P-type region 300. The dummy gate 116 (FIG. 4) and dummy gate dielectric 118 (FIG. 4) may be removed selective to the sidewall spacers 112 by any suitable etching technique known in the art. For example, the dummy gate 116 (FIG. 4) and dummy gate dielectric 118 (FIG. 4) may be selectively etched by means of a wet etch process or a combination of wets and reactive ion etching (RIE).

Etching of the dummy gate 116 (FIG. 4) and dummy gate dielectric 118 (FIG. 4) may create recesses 113 between adjacent sidewall spacers 112. Such recesses may be used in subsequent steps to form an NPN BJT device in sub-region 220 and a PNP BJT device in sub-region 320 as described below. The recesses 113 in sub-region 210 and sub-region 310 may subsequently be filled with a conductive material to form a metal gate for the NMOS FinFET device 212 and PMOS FinFET device 312 as further described below.

Referring now to FIGS. 6-13 a process to integrate a RMG process flow with formation of BJT devices may be described according to an embodiment of the present disclosure.

Figure 6:
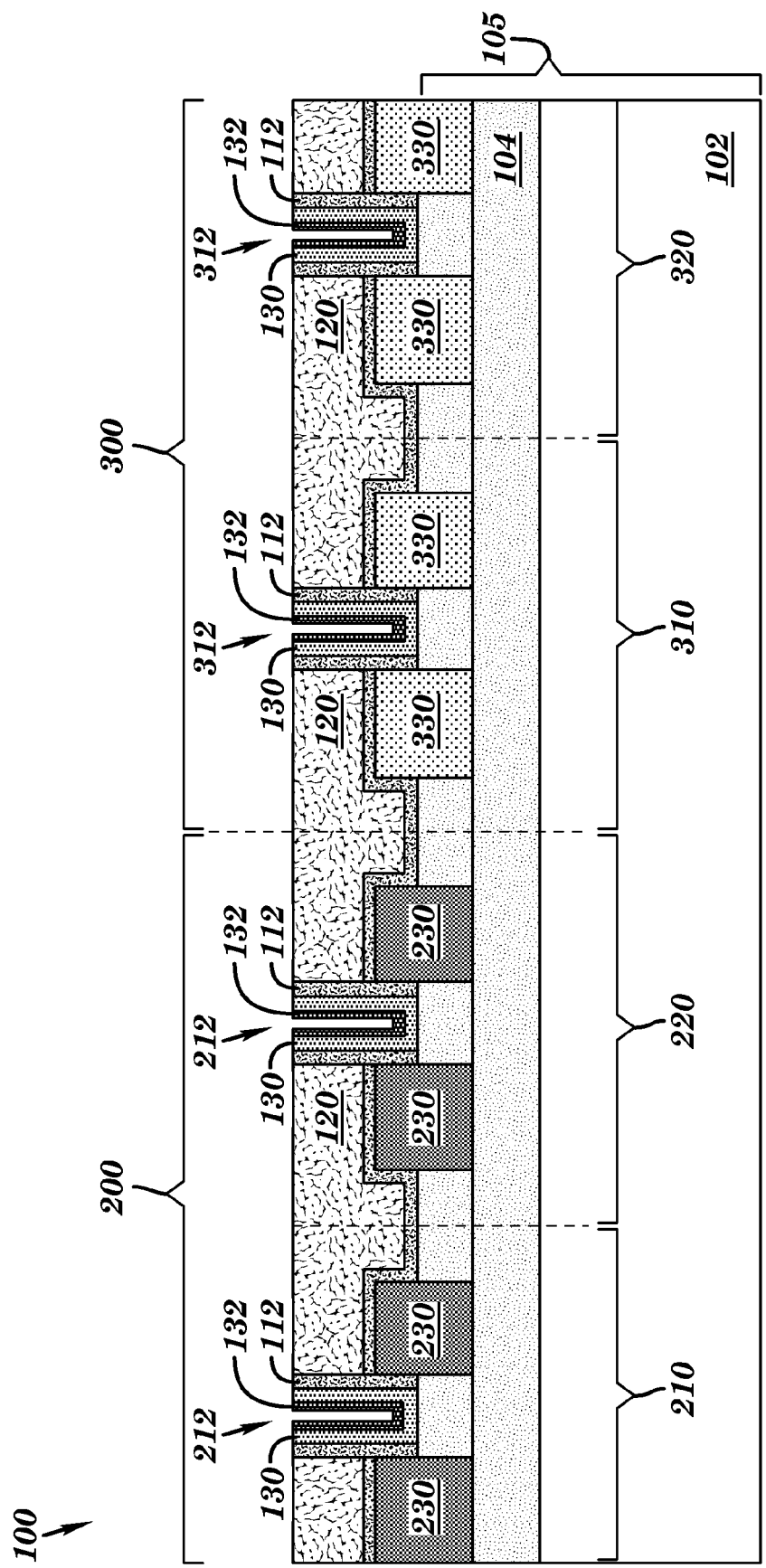
FIG. 6 is a cross-sectional view of FIG. 1 taken along section line A-A depicting the formation of a high-k dielectric layer and a dummy titanium nitride layer in recesses formed after removing the dummy gates, according to an embodiment of the present disclosure.

Referring now to FIG. 6, a high-k dielectric layer 130 may be conformally deposited on the recesses 113 by any suitable deposition technique known in the art, for example: by atomic layer deposition (ALD), chemical vapor deposition (CVD), plasma-enhanced chemical vapor deposition (PECVD), high-density CVD (HDCVD), physical vapor deposition (PVD), plating, sputtering, evaporation, and chemical solution deposition of a high-k dielectric material. The high-k dielectric layer 130 may include a thickness ranging from about 1 nm to about 5 nm. In one embodiment, the high-k dielectric layer 130 may include a high-k dielectric material having a dielectric constant greater than, for example, 3.9, which is the dielectric constant of silicon oxide. The high-k dielectric layer 130 may be required to fulfill the scalability and current-leakage prevention needs of the NMOS FinFET and PMOS FinFET devices 212, 312.

Following the deposition of the high-k dielectric layer 130, a second conformal layer 132 (hereafter referred to as "dummy titanium nitride layer") may be deposited on top of the high-k dielectric layer 130 by any suitable deposition method known in the art. The dummy titanium nitride layer 132 may include a thickness ranging from about 3 nm to about 10 nm. In one embodiment, the dummy titanium nitride layer 132 may include titanium nitride, titanium carbide, tantalum nitride or other suitable material.

After depositing the high-k dielectric layer 130 and the dummy titanium nitride layer 132, the semiconductor structure 100 may be subjected to a planarization process to remove excess material from the top of the semiconductor structure 100. The planarization process may be conducted using any polishing technique known in the art such as for example: chemical mechanical polishing (CMP).

Figure 7:
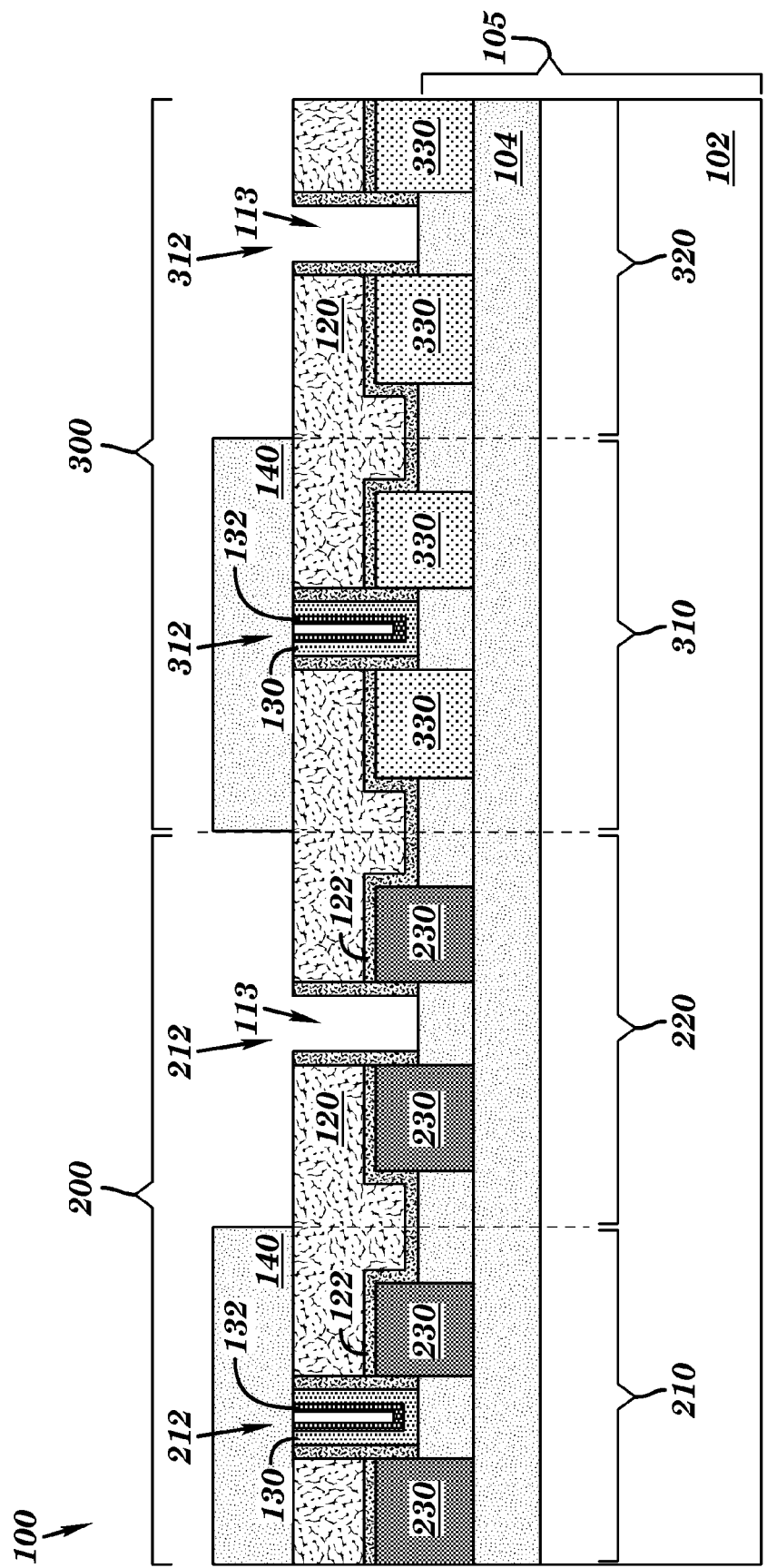
FIG. 7 is a cross-sectional view of FIG. 1 taken along section line A-A depicting masking an NMOS and a PMOS sub-region of the semiconductor substrate, according to an embodiment of the present disclosure.

Referring now to FIG. 7, a first photoresist mask 140 may be formed to cover the NMOS and PMOS sub-regions 210, 310 including the NMOS FinFET devices 212 and PMOS FinFET devices 312. The first photoresist mask 140 may protect the NMOS FinFET and PMOS FinFET devices 212, 312 during the formation of NPN BJT and PNP BJT devices in the NPN and PNP BJT subs-regions 220, 320. The steps involved in masking the NMOS and PMOS sub-regions 210, 310 are well known to those skilled in the art.

Next, the high-k dielectric layer 130 and the dummy titanium nitride layer 132 may be removed from the recesses 113 in the NPN BJT sub-region 220 and the PNP BJT sub-region 320. The removal of the high-k dielectric layer 130 and the dummy titanium nitride layer 132 may occur selectively to the sidewall spacers 112 by means of any etching technique known in the art.

After removing the high-k dielectric layer 130 and the dummy titanium nitride layer 132 from the recesses 113 in the NPN BJT sub-region 220 and the PNP BJT sub-region 320, the first photoresist mask 140 may be removed by any suitable etching technique.

Figure 8:
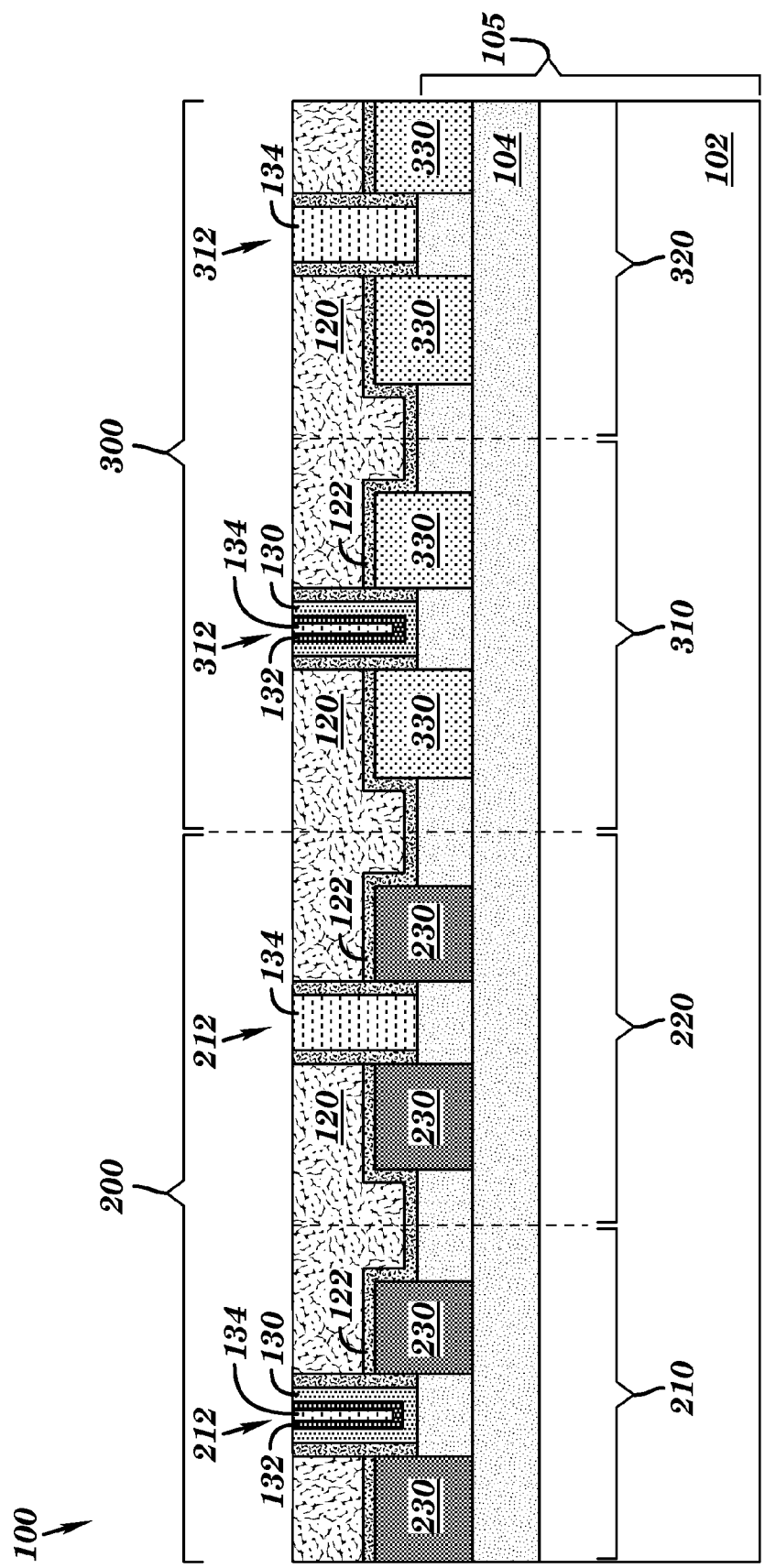
FIG. 8 is a cross-sectional view of FIG. 1 taken along section line A-A depicting the deposition of a silicon cap layer in the CMOS and BJT regions of the semiconductor substrate, according to an embodiment of the present disclosure.

Referring now to FIG. 8, a silicon cap layer 134 may be deposited within the recesses 113 (FIG. 7). In the NMOS and PMOS sub-regions 210, 310, the silicon cap layer 134 may be formed on top of the dummy titanium nitride layer 132 and high-k dielectric layer 130 of the NMOS and PMOS devices 212, 312 respectively, filling the remaining space within recesses 113 (FIG. 7). In the NPN BJT and PNP BJT sub-regions 210, 310, the silicon cap layer 134 may substantially fill the recesses 113.

The silicon cap layer 134 may be formed by any deposition method known in the art, including but not limited to: ALD, CVD, PECVD, HDCVD, PVD and the like. In one embodiment of the present disclosure the silicon cap layer 134 may include an amorphous silicon (a-Si) material. In another embodiment of the present disclosure the silicon cap layer 134 may include a polycrystalline silicon (poly silicon) material. The silicon cap layer 134 may provide a medium to form a P-type or an N-type semiconductor material that may constitute an extrinsic base for the NPN BJT device or PNP BJT device respectively, as described in the steps below.

Figure 9:
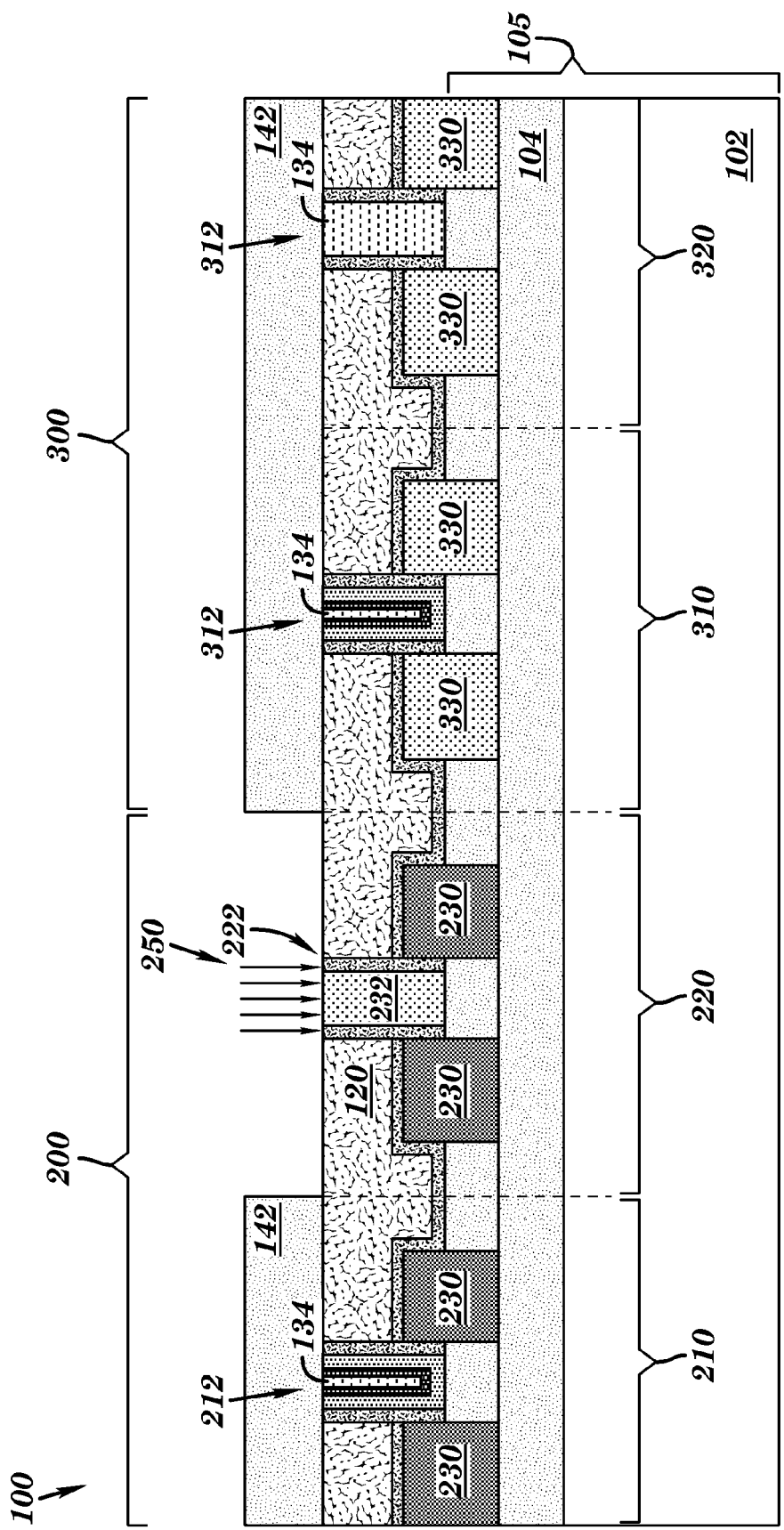
FIG. 9 is a cross-sectional view of FIG. 1 taken along section line A-A depicting an ion implantation technique being conducted on the NPN BJT region of the semiconductor substrate, according to an embodiment of the present disclosure.

Referring now to FIG. 9, a second photoresist mask 142 may be formed to protect the NMOS, PMOS and PNP BJT sub-regions 210, 310 and 320 of the semiconductor substrate 110. At this step of the fabrication process only the NPN BJT sub-region 220 may remain unprotected. After masking the NMOS, PMOS and PNP BJT sub-regions 210, 310 and 320, an ion implantation technique may be conducted on the unprotected NPN BJT sub-region 220 as indicated by arrows 250. The ion implantation process may include the use of P-type dopants, such as boron (B), to provide the appropriate polarity to the silicon cap layer 134 (FIG. 8) located between N-type source-drain region 230 to form a P-type base region 232 and in consequence an NPN BJT device 222. The P-type silicon cap layer 232 may act as an extrinsic base that provides a low resistance contact to the silicon region underneath which is the intrinsic base of the NPN BJT 222. Here it should be noted that in BJTs the N-type source-drain region 230 may typically be referred to as an N-type emitter-collector region.

According to an embodiment of the present disclosure, the dopant concentration of boron (B) to form the P-type silicon cap layer 232 may range from about $1 \times 10^{18}$ ions/cm$^3$ to about $9 \times 10^{20}$ ions/cm$^3$.

At this point of the fabrication process, the second photoresist mask 142 may be removed by means of any suitable etching technique.

Figure 10:
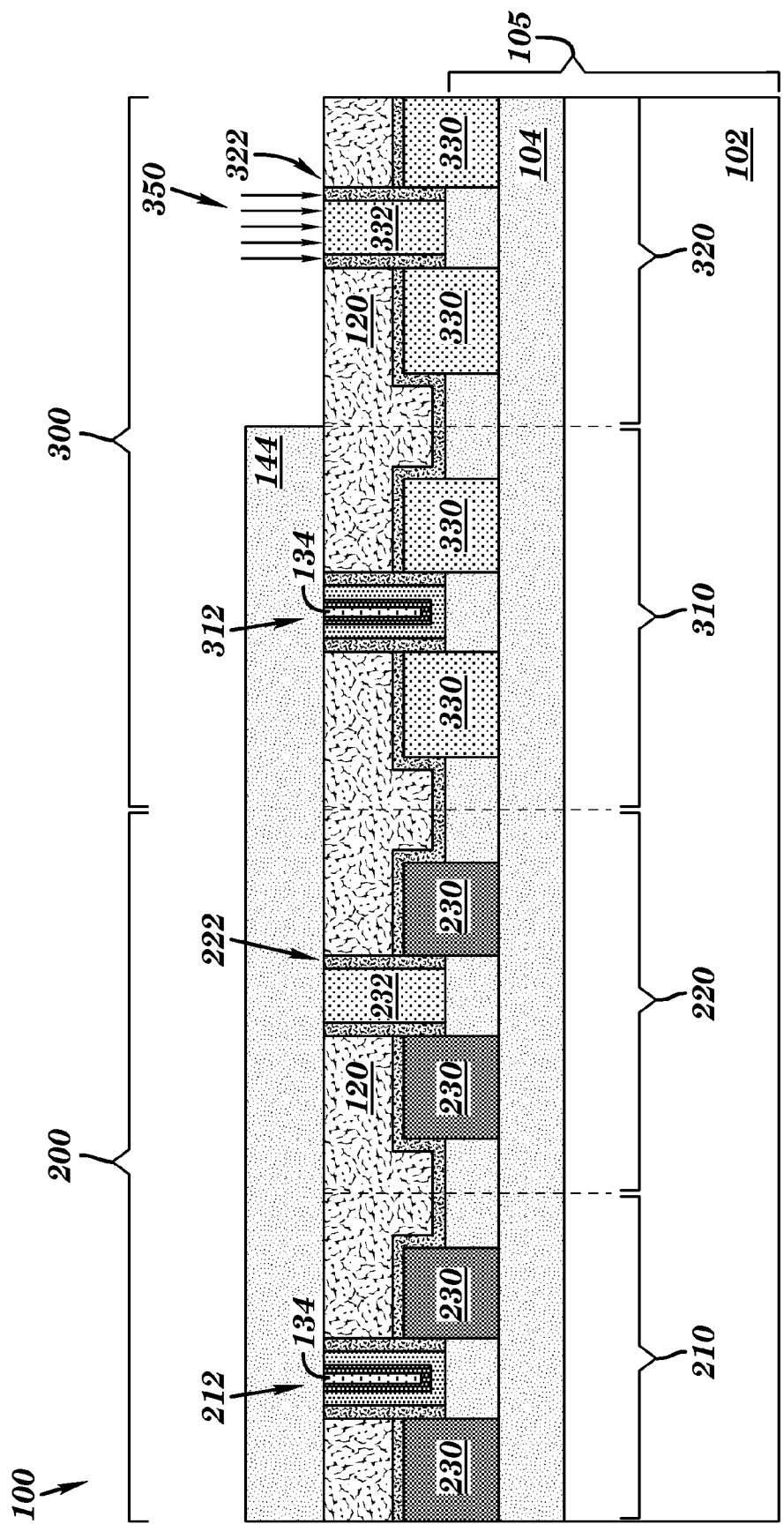
FIG. 10 is a cross-sectional view of FIG. 1 taken along section line A-A depicting an ion implantation technique being conducted on the PNP BJT region of the semiconductor substrate, according to an embodiment of the present disclosure.

Referring now to FIG. 10, a third photoresist mask 144 may be formed to protect the NMOS, NPN BJT and PMOS sub-regions 210, 310 and 220 of the semiconductor substrate 110. At this step of the fabrication process only the PNP BJT sub-region 320 may remain unprotected. After masking the NMOS, NPN BJT and PMOS sub-regions 210, 310 and 220, an ion implantation technique may be conducted on the unprotected PNP BJT sub-region 320 as indicated by arrows 350. The ion implantation process may include the use of N-type dopants, such as phosphorus (P) or arsenic (As), to provide the appropriate polarity to the silicon cap layer 134 (FIG. 9) located between P-type source-drain region 330 to form an N-type base region 332 and in consequence the PNP BJT device 322. The N-type silicon cap layer 332 may act as an extrinsic base that provides a low resistance contact to the silicon region underneath which is the intrinsic base of the PNP BJT 322. Here it should be noted that in BJTs the P-type source-drain region 330 may typically be referred to as a P-type emitter-collector region.

According to an embodiment of the present disclosure, the dopant concentration of phosphorus (P) or arsenic (As) to form the N-type silicon cap layer 332 may range from about $1 \times 10^{18}$ ions/cm$^3$ to about $9 \times 10^{20}$ ions/cm$^3$.

It should be noted that the NPN BJT and PNP BJT devices 222, 322 may be formed following the reverse order, with the PNP BJT device 322 formed before the NPN BJT device 222.

At this point of the fabrication process, the third photoresist mask 144 may be removed by means of any suitable etching technique.

The steps described above in FIGS. 7-10 include the formation of bipolar junction transistors in the corresponding P-type or N-type region of the semiconductor substrate 105, such steps are not characteristic of conventional RMG process during FinFET device manufacturing. These additional steps within the RMG process flow may allow for the formation of BJTs contemporaneously with the formation of high-k FinFET devices having the added benefit of reducing the amount of masks required in traditional BJTs fabrication thus reducing production time and improving process cost-effectiveness.

After formation of NPN BJT device 222 and PNP BJT device 322 an annealing process may be conducted over the semiconductor structure 100 to activate the dopants introduced via ion implantation and remove the crystal structure damage caused by ion irradiation. The annealing process may be conducted by any method known in the art, for example, by rapid thermal annealing (RTA) of the semiconductor structure 100. In an embodiment of the present disclosure, the annealing temperature may range from about 800° C. to about 1100° C. In an embodiment of the present disclosure, the annealing process may also work to cure the high-k dielectric layer 130 in the NMOS FinFET device 212 and the PMOS FinFET 312.

Figure 11:
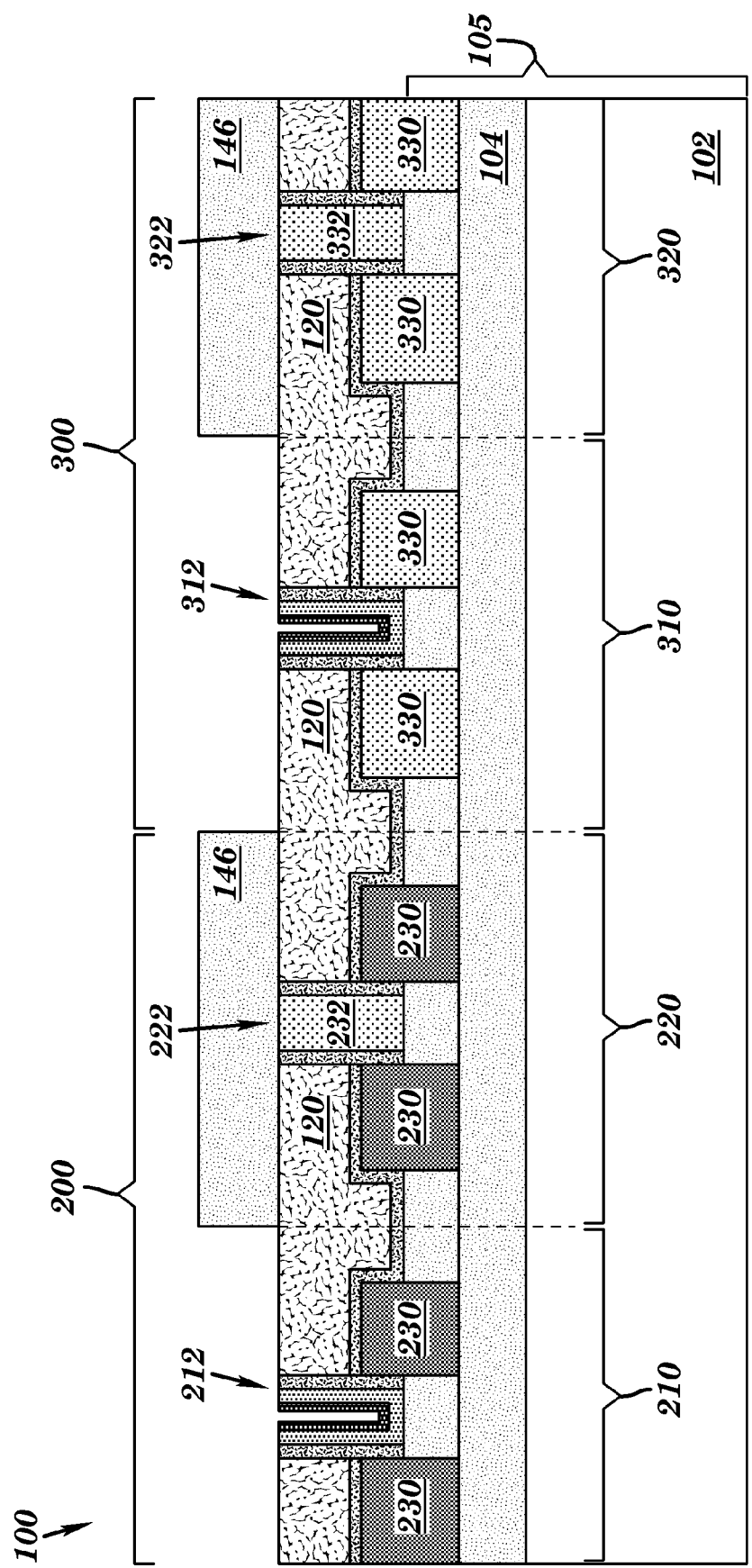
FIG. 11 is a cross-sectional view of FIG. 1 taken along section line A-A depicting the removal of the silicon cap layer from the NMOS and PMOS devices, according to an embodiment of the present disclosure.

Referring now to FIG. 11, the silicon cap layer 134 (FIG. 10) may now be removed from the NMOS FinFET device 212 and PMOS FinFET device 312. In order to remove the silicon cap layer 134 from the NMOS FinFET and PMOS FinFET devices 212, 312, a fourth photoresist mask 146 may be formed on the NPN BJT and PNP BJT sub-regions 220, 320 to protect the bipolar junction transistor devices NPN BJT 222 and PNP BJT 322. Alternatively, a hardmask material may be selectively deposited on sub-regions 220, 320 to protect the NPN BJT 222 and PNP BJT 322 during removal of the silicon cap layer 134. The steps involved in masking the NPN BJT and PNP BJT sub-regions 220, 320 to protect the NPN BJT and PNP BJT devices 222, 322 are conventional and well known to those skilled in the art.

Any suitable etching technique may be used to remove the silicon cap layer 134 from the NMOS and PMOS devices 212, 312. Etching of the silicon cap layer 134 may create recesses between adjacent sidewall spacers 112 in the NMOS FinFET and PMOS FinFET devices 212, 312. Such recesses may be subsequently filled with a conductive material to form a metal gate as shown in FIG. 12.

At this point of the fabrication process, the fourth photoresist mask 146 may be removed by means of any suitable etching technique.

Figure 12:
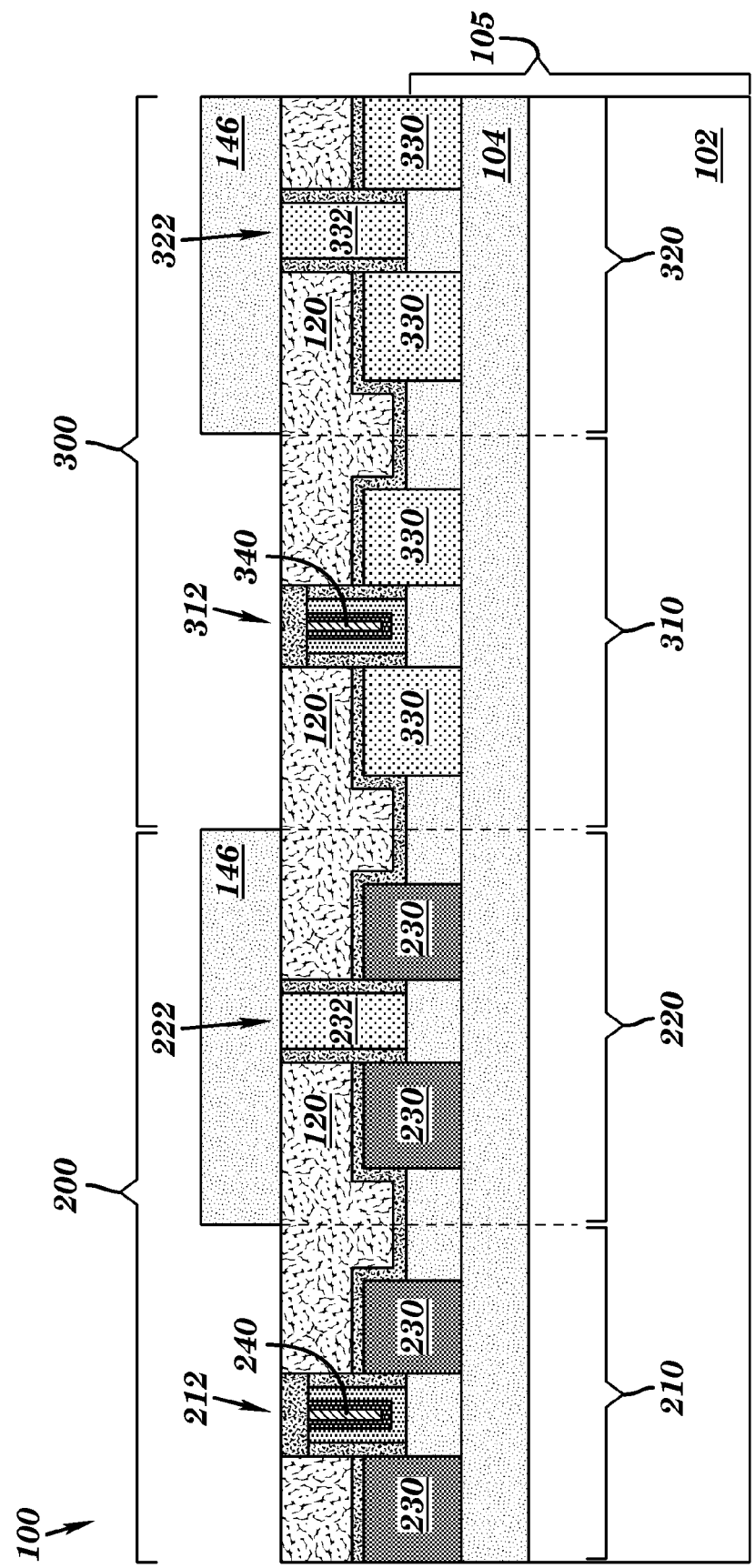
FIG. 12 is a cross-sectional view of FIG. 1 taken along section line A-A depicting the formation of a metal gate in the NMOS and PMOS devices, according to an embodiment of the present disclosure.

Referring now to FIG. 12, at this point of the fabrication process the regular RMG process may continue by forming the corresponding N-type and P-type workfunction metals in the NMOS FinFET device 212 and the PMOS FinFET device 312 respectively. The N-type and P-type workfunction metals forming N-type and P-type metal gates 240, 340 may be formed by any suitable deposition process including, but not limited to CVD, PECVD, HDCVD, PVD, plating, sputtering, evaporation, and chemical solution deposition.

In one embodiment of the present disclosure, the N-type metal gate 240 for NMOS FinFET device 212 may include: titanium nitride (TiN), titanium aluminide (TiAl), titanium aluminum nitride (TiAlN) or other suitable materials.

In another embodiment of the present disclosure, the P-type metal gate 340 for PMOS FinFET device 312 may include: titanium nitride (TiN), tungsten nitride (WN), tantalum nitride (TaN) or other suitable materials.

After formation of the N-type and P-type metal gates 240, 340, the semiconductor structure 100 may include FinFET and BJT devices representing a BiCMOS structure. All the subsequent steps are conventional of CMOS fabrication technology including contact patterning and silicidation.

Figure 13:
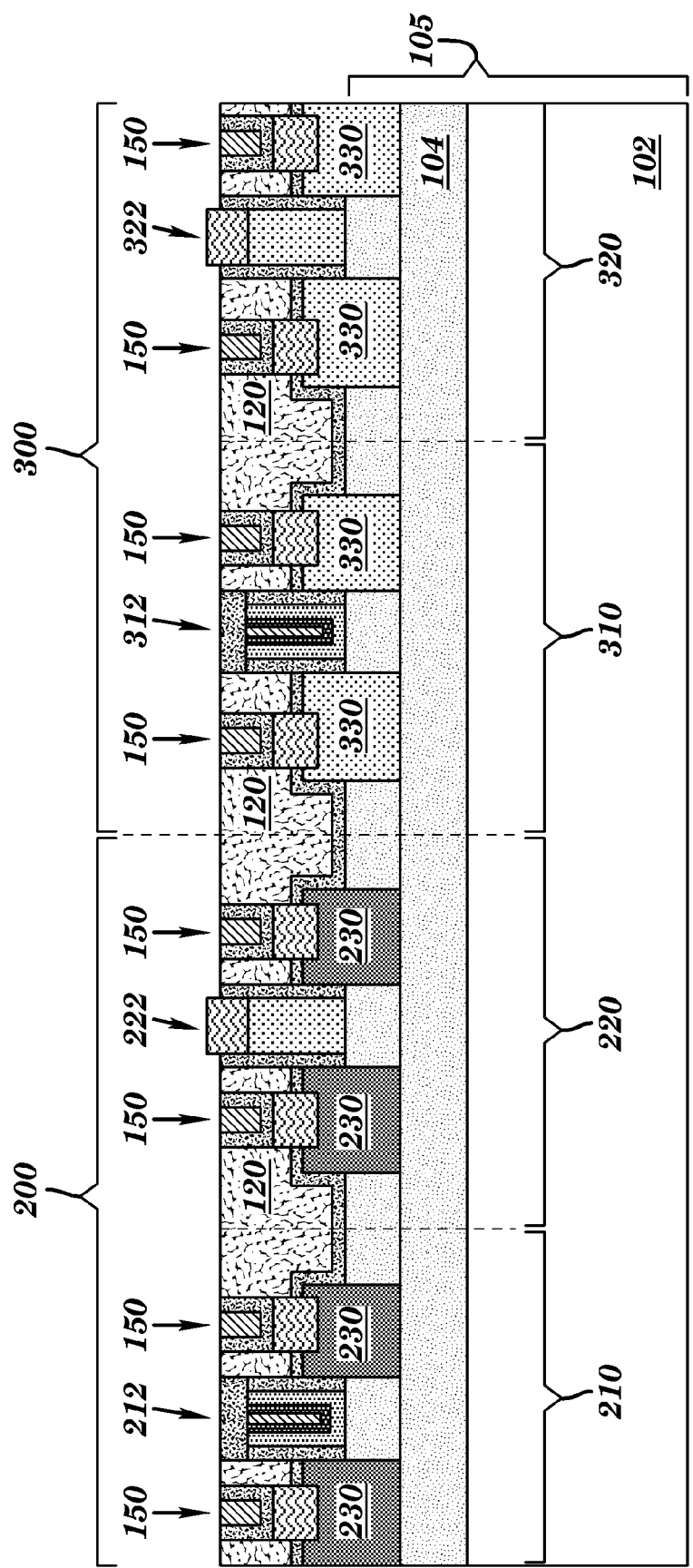
FIG. 13 is a cross-sectional view of FIG. 1 taken along section line A-A depicting the formation of silicided contacts in the semiconductor structure, according to an embodiment of the present disclosure.

Referring now to FIG. 13, contacts may be patterned and formed in the ILD layer 120 and cap layer 122 following conventional methods in CMOS fabrication technology. The formation of contacts may further include salicidation of source-drain regions 230, 330. The contacts 150 may be patterned by means of a photolithography process. Following the photolithography process, areas of the ILD layer 120 and cap layer 122 may be etched to create contact holes and then a metal layer (not shown) may be deposited within the contact holes and over the entire semiconductor substrate by means of any deposition method known in the art including, for example, by CVD, PECVD, HDCVD, PVD, plating, sputtering, evaporation, and chemical solution deposition. In one embodiment of the present disclosure, the metal layer may include a nickel-platinum alloy (NiPt) where the atomic concentration of nickel (Ni) may range from about 5% to 20%. In another embodiment of the present disclosure, the metal layer may include nickel palladium (NiPd), nickel rhenium (NiRe), titanium (Ti), titanium tantalum (TiTa), titanium niobium (TiNb), or cobalt (Co). Alternatively, other metals commonly employed in salicide processing such as tantalum (Ta), tungsten (W), cobalt (Co), nickel (Ni), platinum (Pt), palladium (Pd), or alloys thereof may be employed.

After the metal layer is formed, the semiconductor structure 100 may be subjected to a thermal annealing process, using conventional processes such as, but not limited to, rapid thermal annealing (RTA). During the thermal annealing process, the metal layer reacts with the silicon present in the source-drain regions 230, 330 to form a metal silicide. After the annealing process, an etching process may be carried out to remove substantially all un-reacted metal or metal alloy of the remaining portion of the metal layer. The etching process may include a wet etching method.

The steps described above may provide a method of forming a BiCMOS structure combining the positive characteristics of CMOS FinFET and BJT technologies to enhance device performance. Furthermore, the integration of CMOS RMG process with the formation of BJT devices may facilitate the formation of high-k FinFET devices and BJT devices in a shared semiconductor substrate having the added benefit of reducing the number of mask required in the process optimizing production time and improving process cost-effectiveness.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of forming a semiconductor structure, comprising:

forming a first recess and a second recess between a first pair of sidewall spacers and a second pair of sidewall spacers respectively, the first pair of sidewall spacers and the second pair of sidewall spacers surrounding a fin on top of a buried dielectric layer, the fin formed from a top most semiconductor layer of a semiconductor-on-insulator substrate, and the fin extending outwardly from a gate structure formed over the buried dielectric layer;

depositing a high-k dielectric layer within the first recess and within the second recess;

depositing a dummy titanium nitride layer on the high-k dielectric layer;

removing the high-k dielectric layer and the dummy titanium nitride layer from the second recess without removing the high-k dielectric and dummy titanium nitride layers from the first recess;

depositing a silicon cap layer to fill the first recess and the second recess, the silicon cap layer being formed above the high-k dielectric layer and dummy titanium nitride layer in the first recess; and implanting dopants into the silicon cap layer in the second recess without implanting dopants into the silicon cap layer in the first recess to form a bipolar junction transistor (BJT) device.

2. The method of claim 1, wherein depositing the silicon cap layer comprises forming an amorphous silicon layer or a polysilicon layer to fill the first and second recesses.

3. The method of claim 1, wherein implanting dopants into the silicon cap layer in the second recess comprises:

forming an N-type extrinsic base region for a PNP bipolar junction transistor (BJT) device; and forming a P-type extrinsic base region for an NPN BJT device.

4. The method of claim 1, further comprising:

forming an emitter-collector region adjacent to a base region.

5. The method of claim 4, wherein forming the emitter-collector region adjacent to the base region comprises:

forming a P-type emitter-collector region adjacent to the N-type extrinsic base region; and forming an N-type emitter-collector region adjacent to the P-type extrinsic base region.

6. A method of forming a semiconductor structure, comprising:

forming a first dummy gate above a first fin formed from a SOI layer of a semiconductor substrate, the first dummy gate being located between first sidewall spacers with a portion of the first fin not covered by the first dummy gate defining a first source-drain region;

forming a second dummy gate above a second fin formed from the SOI layer of the semiconductor substrate, the second dummy gate being located between second sidewall spacers with a portion of the second fin not covered by the second dummy gate defining a second source-drain region;

removing the first dummy gate and the second dummy gate to create a first recess and a second recess between the first sidewall spacers and the second sidewall spacers respectively;

depositing a high-k dielectric layer within the first recess and within the second recess;

depositing a dummy titanium nitride layer on the high-k dielectric layer;

removing the high-k dielectric layer and the dummy titanium nitride layer from the second recess without removing the high-k dielectric and dummy titanium nitride layers from the first recess;

depositing a silicon cap layer to fill the first recess and the second recess, the silicon cap layer being formed above the high-k dielectric layer and dummy titanium nitride layer in the first recess;

implanting dopants into the silicon cap layer in the second recess without implanting dopants into the silicon cap layer in the first recess to form a bipolar junction transistor (BJT) device;

removing the silicon cap layer in the first recess; and forming a metal gate on top of the high-k dielectric layer and dummy titanium nitride layer in the first recess.

7. The method of claim 6, wherein depositing the silicon cap layer comprises forming an amorphous silicon layer or a polysilicon layer to fill the first and the second recesses.

8. The method of claim 6, wherein implanting dopants into the silicon layer in the second recess comprises:

forming an N-type extrinsic base region for a PNP bipolar junction transistor (BJT) device; and forming a P-type extrinsic base region for an NPN BJT device.

9. The method of claim 8, wherein forming the N-type extrinsic base region comprises implanting N-type dopants including arsenic and phosphorous.

10. The method of claim 8, wherein forming the P-type extrinsic base region comprises implanting P-type dopants including boron.

11. The method of claim 6, further comprising:

forming an emitter-collector region adjacent to an extrinsic base region.

12. The method of claim 11, wherein forming the emitter-collector region adjacent to the extrinsic base region comprises:

forming a P-type emitter-collector region adjacent to the N-type extrinsic base region; and forming an N-type emitter-collector region adjacent to the P-type extrinsic base region.

13. The method of claim 6, wherein forming the metal gate in the first recess comprises:

depositing a P-type metal or an N-type metal on top of the high-k dielectric layer and dummy titanium nitride layer.

14. The method of claim 13, wherein depositing a P-type metal or an N-type metal comprises:

selecting the P-type metal from a group of conductors consisting of titanium nitride (TiN), tungsten nitride (WN), tantalum nitride (TaN) or other suitable materials; and selecting the N-type metal from a group of conductors consisting of titanium nitride (TiN), titanium aluminide (TiAl), titanium aluminum nitride (TiAlN) or other suitable materials.

* * * * *